United States Patent
Nardone et al.

(10) Patent No.: US 8,214,774 B2
(45) Date of Patent: Jul. 3, 2012

(54) METHOD FOR IMPLEMENTING FUNCTIONAL CHANGES INTO A DESIGN LAYOUT OF AN INTEGRATED DEVICE, IN PARTICULAR A SYSTEM-ON-CHIP, BY MEANS OF MASK PROGRAMMABLE FILLING CELLS

(75) Inventors: Valentina Nardone, Avezzano (IT); Stefania Stucchi, Cornate D'Adda (IT); Luca Ciccarelli, Rimini (IT); Lorenzo Calí, Besana Brianza (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 213 days.

(21) Appl. No.: 12/648,953

(22) Filed: Dec. 29, 2009

(65) Prior Publication Data

US 2010/0201400 A1     Aug. 12, 2010

(30) Foreign Application Priority Data

Dec. 30, 2008   (IT) .............................. MI2008A2358

(51) Int. Cl.
*G06F 17/50* (2006.01)
*G06F 19/00* (2006.01)
*G01R 31/28* (2006.01)
*H03K 19/173* (2006.01)
*H01L 25/00* (2006.01)

(52) U.S. Cl. .......... 716/54; 716/112; 716/121; 716/138; 716/136; 714/726; 714/732; 714/733; 714/734; 714/738; 700/121; 326/38; 326/41; 326/47; 326/101; 703/16

(58) Field of Classification Search ............. 716/54, 716/112, 121, 138, 136; 714/726, 732, 733, 714/734, 738; 700/121; 326/38, 41, 47, 326/101; 703/16
See application file for complete search history.

(56) References Cited

U.S. PATENT DOCUMENTS

| | | | |
|---|---|---|---|
| 5,572,710 A * | 11/1996 | Asano et al. ...................... 703/15 |
| 6,086,631 A * | 7/2000 | Chaudhary et al. ........... 716/116 |
| 6,099,583 A * | 8/2000 | Nag .............................. 716/117 |
| 6,167,558 A * | 12/2000 | Trimberger ................... 716/117 |
| 6,255,845 B1 | 7/2001 | Wong et al. ..................... 326/38 |
| 6,292,925 B1 * | 9/2001 | Dellinger et al. ............. 716/113 |
| 6,453,454 B1 | 9/2002 | Lee et al. ......................... 716/11 |
| 6,530,049 B1 * | 3/2003 | Abramovici et al. ......... 714/725 |
| 7,103,434 B2 * | 9/2006 | Chernyak et al. .............. 700/98 |
| 7,646,630 B2 * | 1/2010 | Lowrey et al. ............... 365/163 |
| 7,683,403 B2 * | 3/2010 | Tripathi ....................... 257/202 |

(Continued)

OTHER PUBLICATIONS

Abramovici et al., "A new approach to in-system silicon validation and debug", IEEE Design & Test of Computers, vol. 25, No. 3, May 2008, pp. 216-223.

(Continued)

*Primary Examiner* — Phallaka Kik
(74) *Attorney, Agent, or Firm* — Allen, Dyer, Doppelt, Milbrath & Gilchrist, P.A.

(57) ABSTRACT

A System-on-Chip (SoC) may include logic blocks connected to each other and to external connections, and a hardware debug infrastructure logic connected to the logic blocks and for performing functional changes to a design layout of the SoC. The hardware debug infrastructure logic may include software re-configurable modules based upon the logic blocks obtained from substituting a mask programmable ECO base cell configured as a functional logic cell for a logic cell in the design layout.

14 Claims, 4 Drawing Sheets

U.S. PATENT DOCUMENTS

| | | | |
|---|---|---|---|
| 7,919,981 B2 * | 4/2011 | Irie | 326/46 |
| 7,949,988 B2 * | 5/2011 | Tsai et al. | 716/139 |
| 2001/0001881 A1 * | 5/2001 | Mohan et al. | 716/1 |
| 2005/0076316 A1 * | 4/2005 | Pierrat et al. | 716/4 |
| 2005/0080502 A1 * | 4/2005 | Chernyak et al. | 700/97 |
| 2005/0235240 A1 | 10/2005 | Tien | 716/11 |
| 2006/0218517 A1 * | 9/2006 | Siegler et al. | 716/10 |
| 2007/0288219 A1 * | 12/2007 | Zafar et al. | 703/14 |
| 2008/0037318 A1 * | 2/2008 | Hidaka | 365/171 |
| 2008/0120586 A1 * | 5/2008 | Hoerold | 716/9 |
| 2009/0031261 A1 * | 1/2009 | Smith et al. | 716/2 |
| 2009/0032899 A1 * | 2/2009 | Irie | 257/499 |
| 2009/0249273 A1 * | 10/2009 | Tsai et al. | 716/8 |
| 2010/0175038 A1 * | 7/2010 | Hopkins et al. | 716/12 |
| 2010/0257502 A1 * | 10/2010 | Matsuoka | 716/11 |
| 2010/0275167 A1 * | 10/2010 | Fu et al. | 716/2 |

OTHER PUBLICATIONS

Abramovici et al., "A reconfigurable design-for-debug infrastructure fo SoCs" 2005 43$^{rd}$ ACM/IEEE Design Automation Conference, Jul. 2006, pp. 7-12.

Chang et al., "Automating post-silicon debugging and repair", IEEE Service Center, vol. 41, No. 7, Jul. 2008, pp. 47-53.

* cited by examiner

Table I

| Cells pairs | Number of used 4TunE base cells | Number of 4TunE base cells used in an ad-hoc library | Area reduction |
|---|---|---|---|
| AO2NHVTX1 + FD1TQHVTX1 | 3 + 9 | 11 | 8% |
| IVHVTX2 + AO2NHVTX1 | 1 + 3 | 3 | 25% |
| AO2NHVTX1 + AO2NHVTX1 | 3 + 3 | 5 | 16% |
| AO2NHVTX1 + FD2TQHVTX1 | 3 + 11 | 13 | 7% |
| AO4HVTX1 + FD2TQHVTX1 | 2 + 11 | 13 | 0% |
| IVHVTX2 + AO2NHVTX1 | 1 + 3 | 3 | 25% |
| AO2NHVTX1 + AO2NHVTX8 | 3 + 3 | 5 | 16% |
| FD2TQHVTX1 + IVHVTX2 | 11 + 1 | 11 | 8% |

FIG. 4

METHOD FOR IMPLEMENTING FUNCTIONAL CHANGES INTO A DESIGN LAYOUT OF AN INTEGRATED DEVICE, IN PARTICULAR A SYSTEM-ON-CHIP, BY MEANS OF MASK PROGRAMMABLE FILLING CELLS

FIELD OF THE INVENTION

The present invention relates to a method for implementing changes to the functionality of a design layout of an integrated device, in particular, a System-on-Chip (SoC) through mask-programmable filler cells.

The present invention also relates to a SoC instrumented with debug infrastructure logic which can be used to implement functional changes.

BACKGROUND OF THE INVENTION

As is known, demands of consolidating functions and applications from printed circuit board to a single chip are growing stronger. These demands have made the scales and designs of an Integrated Circuit (IC) increasingly complex and time consuming. For this reason, Computer-Aided Design (CAD) has become a useful tool to speed up and improve the quality of IC design. In particular, physical layout takes up a major portion of the cycle of designing an Application Specific Integrated Circuit (ASIC).

In creating a physical layout of an ASIC, a computer layout may be first generated generally by arranging a number of individual blocks or "logic cells" based on designated schematics. The functionality and design of individual logic cells may be predetermined and stored on a computer system as a standardized cell design. Such cell design techniques can save time in design cycle, as it may be no longer necessary for an IC designer to custom design each individual gate and transistor in an IC. Rather, the circuit designer breaks down a new circuit design into a number of known (or new) cell designs and then combines these cells appropriately to generate a circuit layout that performs a desired function. Each of the logic cells contains a number of terminals for implementing into the IC. To release the layout to make a mask for semiconductor processing, the data is loaded onto a tape, and is given to a mask shop, the so-called tape-out phase. To tape-out such a computer layout, commercial place-and-route CAD tools are used. More particularly, place-and-route CAD programs are used to arrange logic cells and other elements to optimize their interconnections and the overall size and to define the routing region and to select channels to connect the logic cells and elements.

A place-and-route CAD tool uses as an input a predetermined number of predefined logic cell types (e.g., Inverter, NAND, NOR, XOR, Multiplexer, flip-flop, de-coupling capacitor, etc.) to implement the tasks mentioned above. In response, the place-and-route CAD tool outputs a computer layout. Using the computer layout generated as a blueprint, a number of basic CMOS transistor layers, contact, and metal layers defining the elements and interconnections of the IC are created in silicon through a combination of semiconductor processes, namely depositing, masking, and etching. When combined, these layers form the IC with functions.

Depending on the complexity of the ASIC, each circuit may involve multiple basic layers, multiple contacts, and multiple metal layers. This layer-pattern-release procedure is widely known as tape-out. Following tape-out, for various reasons including design changes, modifications are subsequently used to delete as well as add logic elements and interconnections from the original design. When this occurs, an engineering change order (ECO) is generated to document the desired changes. Next, the earlier generated computer layout is modified using the commercial place-and-route CAD tool to incorporate the desired changes.

Under typical methods, extra logic cells, spare or mask-programmable filler cells, of different types are included in the original computer layout as reserves in case new elements are needed. However, due to limitations inherent in the software environment, the place-and-route CAD limits uses that these extra logic cells to predefined types and numbers. For that reason, the spare cells mix and placement have to be defined at a compile step of the IC design, namely before the tape-out, thus reducing the margins for new changes. Because the types of the logic cells are predefined as Inverter, NAND, NOR, XOR, Multiplexer, flip-flop, de-coupling capacitor, etc., modifications are limited to changing the logic cells connectivity. Such inflexibility may be undesirable.

For instance, in adding logic elements as used under an ECO, a logic cell of a certain type may not be available for implementing a desired function. As a result, either the desired function may be deleted or the process of generating a computer layout with the desired logic cells may be restarted and, of course, neither one of these options is desirable.

In addition, even if the right type logic cells are available for adding, the layout engineer may still make the proper connections, but, because the locations of the logic cells are fixed, it is sometimes not possible to provide the desired connections given existing obstacles and various space constraints in the layout. Moreover, it is a painful and time-consuming task to identify the extra logic cells and provide the proper wiring to properly connect the added cells. Because of the increasing complexity of the IC design and modification, the turn-around time to incorporate the desired ECO changes is generally high.

In addition, within the design community, a design style using a typical SoC which uses mask-programmable base cells, called ECO base cells, to replace spare cells approach for ECO implementation is also known. Such an approach allows the implementation of extra logic devoted to an error fix or ECO in a later phase of the ASIC implementation flow, thus saving design time and cost.

Recently, some mask-programmable technologies have appeared on the market with the aim to avoid the early definition of spare cells functionality in the implementation flow and to enable late changes by way of metal masks. Nevertheless, such methods are inefficient in terms of area, and in terms of performance for the implementation of debug infrastructures.

An approach which implements a simplified design technique into a device layout design through a flexible ECO base cell is described in the U.S. Patent Application Publication No. 2005/0235240 to Tien. This patent application discloses a method for reducing layer revisions in the ECO through a symmetrical ECO base cell having an N-well and a P-well, P+ implant and N+ implant regions, N-well pick-up and P-well pick-up regions, a first power supply line, and a second power supply line. This ECO base cell has a same configuration as a standard logic cell and is alterable in at least one metal layer of the chip for making one or more connections to form a functional logic cell, like Inverter, NAND, NOR, XOR, Multiplexer, flip-flop, de-coupling capacitors, etc.

Moreover, according to the method described in this document, after placing one or more standard logic cells in the layout design according to at least one preliminary design file, one or more ECO base cells are further placed in one or more spare regions. The so placed standard logic cells are routed according to the preliminary design file. Then, at least one metal layer of at least one of the ECO base cells is altered to form the functional cell if such functional cell is needed and the placed standard logic cells are rerouted to be integrated with the thus formed functional cell.

In fact, in an original design, one or more logic cells (i.e. ECO base cells already configured as functional cells) may be placed and connected through routing to form higher level functions, and one or more base cells (i.e. ECO base cells not yet configured or virgin cells) may also be placed in predetermined locations as fillers already prepared for future revision need.

In particular, during a following design revision, the base cells can be transformed into logic or target cells through metal to silicon contacts, metal to polysilicon contacts, or other metal layer changes. Even if this approach has some advantages, it has the drawback of allowing logic changes only by mask modifications. In fact, new logic functions can be implemented exploiting the filler cell area but it can only be programmed by way of metal to silicon contacts, metal to polysilicon contacts, and metal masks. Moreover, the cell topology and granularity obtained are not optimized for a hardware debug logic implementation.

In particular, this approach with less than optimal cell topology and granularity, causes an area increase of the logic cells, increasing the routing resources needed in the ECO implementation, this being a problem for design development. As a consequence, the method described above is not efficient in terms of costs and is time consuming.

It is also known that, in spite of huge efforts in design verification, errors are still found in about two thirds of newly manufactured SoCs. The most recently developed devices however have short market windows, and the delays caused by inefficient and unpredictable debugging significantly increase the time-to-market of such devices, and thus result in a significant loss of market share, or even a complete loss of revenue.

The most commonly used tools for silicon debugging are debuggers for embedded software, but these tools provide only limited observation into the SoC hardware domain, mostly by monitoring processor busses. Most in-house techniques thus rely on ad-hoc Design for Debug (DfD) structures added to the design to provide some internal observation. However, the DfD structures are design-specific, there are no automatic tools to insert them or process the information they provide, and in general, there is little reuse from project to project. Moreover, the software used to configure and operate custom instrumentation is often inadequate. Manual instrumentation of thousands of signals takes a long time, is error-prone, and cannot easily accommodate subsequent design changes. In essence, ad-hoc methods do not scale well for future designs.

A known approach that creates DfD structures in an existing silicon layout is described in the article entitled "A Re-configurable Design-for-Debug Infrastructure for SoCs" published by DAFCA, Inc., Proc. 43rd IEEE Design Automation Conference 16, pp 7-12, July 24-28, 16. This article discloses a re-configurable logic, called "distributed re-configurable fabric", whose components are DfD structures that can be widely distributed on a silicon layout and that are generated on-the-fly for a target SoC. Moreover, the models of the generated instruments are automatically inserted in the Register Transfer Language (RTL) model of such a SoC and the instrumented RTL design goes through the normal synthesis and physical design flow.

The SoC with DfD structures described in this article comprise several types of re-configurable instruments, such as: a Signal Probe Network (SPN) that is a multiplexer (MUX) network that collects a group of signals and selects a subgroup of them to be brought to processing instruments; a Debug Monitor (DEMON) that analyzes a group of signals; a Wrapper that has signal analysis features; a Tracer that contains a buffer memory that can record inputs signals; a CapStim that is a Tracer whose memory may be preloaded with vectors; a Serial Access Node (SAN) to prepare data for communication with an external world; and a Primary CONtroller (PCON) to manage communication with the external world.

This software re-configurable DfD infrastructure logic allows observation and control of some internal signals of the SoC and thanks to its reconfiguration capability, it is also possible to implement functional changes on the final device, after receiving silicon back from the semiconductor process, without resorting to costly ECO techniques. ECO mask changes are needed only if the software re-configurable DfD infrastructure cannot be used to fix errors or to implement the requested functional changes.

The debug structures or tools reside in a workstation connected to the target SoC via a JTAG (acronym of "Joint Test Action Group") cable. They configure and operate the debug instruments using only the standard JTAG pins and the JTAG clock. Even if the described approach is advantageous for several aspects, it has the drawback that a new product revision is needed in order to change the used debug structures.

SUMMARY OF THE INVENTION

An object is to provide a method for implementing debug infrastructures in a System-on-Chip (SoC) having structural and functional features allowing for reduced design revision time and costs, overcoming the limitations and the drawbacks of the known debug methods.

A method is for implementing changes to the functionality of a design layout of an integrated device, in particular a SoC functional changes on its design layout through mask programmable filler cells by way of coarse grain functions. These filler cells are Engineering Change Order (ECO) base cells comprising a first pair of MOS transistors with a common gate and a second pair of MOS transistors with separate gates and having unmodified metal contact layers. In particular, the method uses the filler cells' area to enhance silicon visibility for advanced on-field silicon device validation, debug, and diagnosis.

Based on this idea, the object is addressed by a method for implementing changes to the functionality of a design layout of an integrated device, in particular a SoC, comprising the steps of: providing a design instrumentation with debug infrastructure logic by using standard logic cells or by placing at least one standard logic cell in at least one spare region of the design layout according to a preliminary design file, and executing a standard synthesis of the design files according to the preliminary design file. This method may also include executing a Place & Route of the design layout by replacing the standard filler cells with mask programmable ECO base cells configured as filler cells, and implementing functional changes on the design layout by exploiting a software reconfiguration capability of the debug logic infrastructure based on logic blocks which are obtained by using standard logic cells or by replacing the at least one standard logic cell with at least one mask programmable ECO base cell configured as functional logic cells. The method may also include executing a modification of the design instrumentation; executing a synthesis of the modification applied to the design debug infrastructure logic; and executing on the SoC an ECO flow by replacing at least one mask programmable ECO base cell configured as filler cell and placed during the Place & Route design layout phase with at least one mask programmable ECO base cell configured as functional cell.

Advantageously, the step of executing a synthesis of the modification applied to the debug infrastructure logic could comprise using an ad-hoc library containing the ECO base cells configured as functional cells and specifically developed for DfD infrastructure logic implementation.

Advantageously, the ad-hoc library includes coarse grain functions implemented as single functional cells. Suitably, the coarse grain functions could include a complex function which is implemented by using at least a cells pair of a generic ECO library. Also advantageously, information on an area occupation of the cells pairs could be extracted from a taped out net-list. Suitably modification to the debug infrastructures could be implemented by exploiting mask programmable filler cells area only.

The technical problem is also addressed by a SoC comprising custom logic blocks connected to each other and to outside the system, characterized in that it comprises a hardware debug logic infrastructure connected to the logic blocks and is able to implement functional changes to an original design layout of the SoC, the hardware debug logic infrastructure comprising via software re-configurable modules based on logic blocks, which can be obtained by using standard logic cells or by replacing at least one standard logic cell used in the original design layout with at least one mask programmable ECO base cell configured as functional logic cell. In particular, the at least one mask programmable ECO base cell is already placed in the layout design as a filler cell and changes configuration from a filler cell to a functional logic cell by way of only metal layer changes.

It is particularly remarked that, advantageously, the ECO process is used for changing the hardware of the DfD unit, when a problem is encountered which is not solved even by the DfD unit. In particular, in order to change the hardware of the DfD unit, filler cells already present in the original layout are used, in particular by changing their configuration from filler cells to functional logic cells, such a changing only requiring metal layer changes and not a contacts change, as in the prior art approaches.

Advantageously, the software re-configurable modules could comprise: a hardware logic module able to observe and control critical signals received from the logic blocks and which is re-configurable via a dedicated software that permits modification of the behavior of the control critical signals and verification of the functional changes, thus implementing a design layout instrumentation modification; a debug module comprising a tracer memory able to collect data in a dedicated dual port memory buffer and a programmable trigger engine module able to build trigger functions to enable and disable data storage; a multiplexer network module able to connect the hardware logic module to the debug module for data storage purpose; and interface modules able to manage communication between the SoC and an external world. Also advantageously, the hardware logic module comprises Test Access Port (TAP) and/or wrapper modules for debug purpose.

The technical problem is further addressed by using of coarse grain cells based on mask programmable ECO base cells for implementing changes to the functionality of a design layout of an integrated device, in particular a SoC, wherein the coarse grain cells are developed to optimize area, timing, and routing overhead impact of the ECO on a SoC.

The features and the advantages of the method and device according to the invention may be evident from the following description of a purely exemplary and not limiting embodiment, referring to the attached drawings.

BRIEF DESCRIPTION OF THE DRAWINGS

FIG. 4 is a table reporting the percentage of area reduction for logic cells pairs using a debug infrastructure logic implemented by the method according to the invention.

DETAILED DESCRIPTION OF THE PREFERRED EMBODIMENTS

Figure 1:
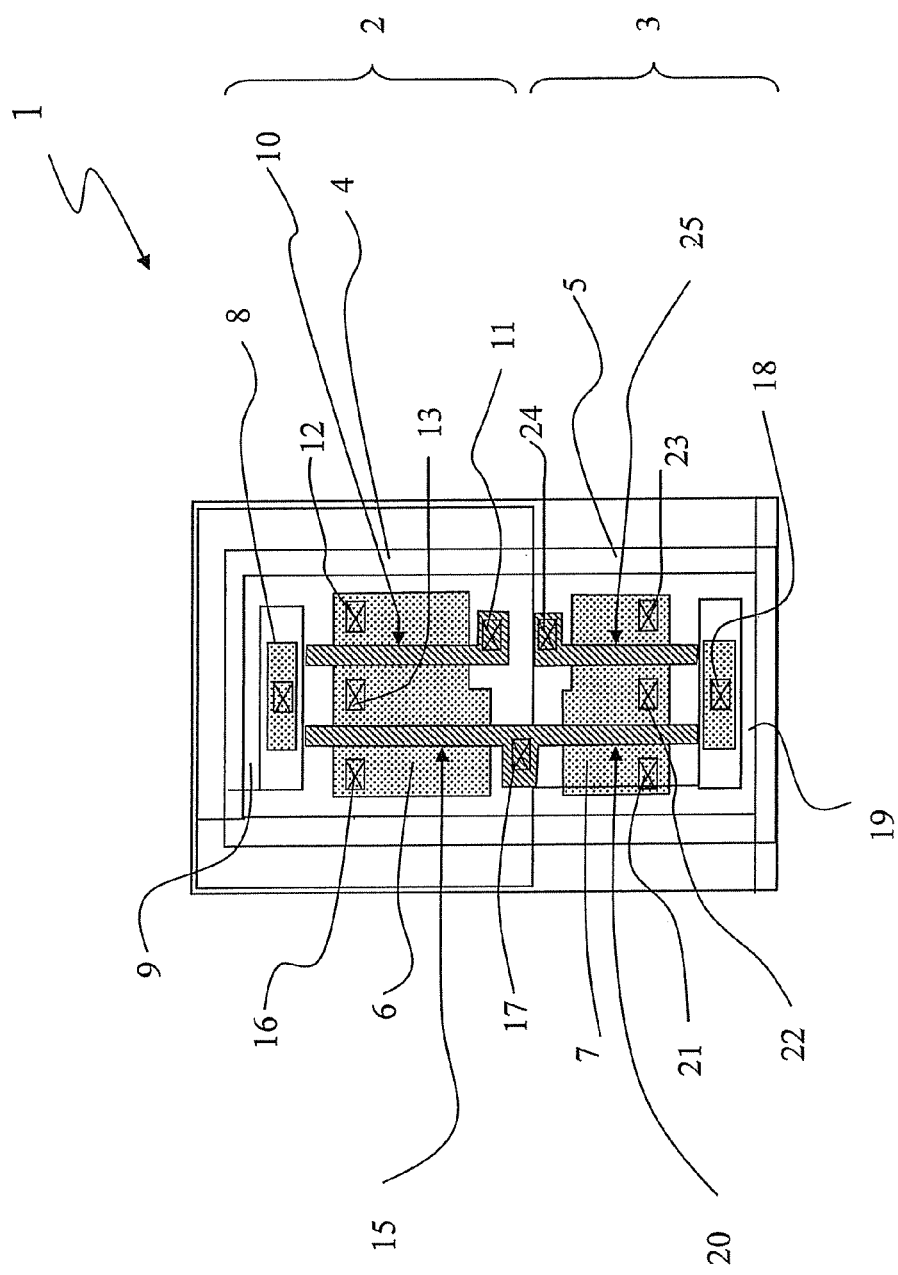
FIG. 1 is a top view of an ECO base cell used as a filler cell by the method according to the invention.

Referring specifically to FIG. 1, a top view of a layout of an Engineering Change Order (ECO) base cell 1 according to the present invention is shown. It should be noted that the base cell 1 is asymmetrical because of the lack of a virtual center line, with respect to which all patterns of material layers are symmetrically mirrored. In particular, according to this embodiment, the base cell 1 comprises four devices, such as NMOS transistors and PMOS transistors. A P side 2 and an N side 3 are thus defined in the base cell 1.

In particular, an N-well 4 provides a substrate wherein two PMOS transistors are formed and a P-well 5 provides a substrate wherein two NMOS transistors are formed. A P+ region 6 and an N+ region 7 are implanted on the substrates provided respectively by the N-well 4 and the P-well 5. In particular, the P+ implant of the P+ region 6 forms the source and drain regions of the PMOS transistors, as well as the N+ implant of the N+ region 7 forms the source and drain regions of the NMOS transistors.

The base cell 1 advantageously comprises a first PMOS transistor 10, in turn having: a source region isolated from all other devices with a source terminal 12; a dedicated gate region having a gate terminal 11; and a drain region connected with a drain region of a second PMOS transistor 15 through a common drain terminal 13. In addition, the second PMOS transistor 15 has a source region isolated from all other devices with a source terminal 16; and a gate region is connected with the gate region of a first NMOS transistor 20, having a common gate terminal 17.

The first NMOS transistor 20 has a source region isolated from all other devices with a source terminal 21 and a drain region connected with a drain region of a second NMOS transistor 25, having a common drain terminal 22. The second NMOS transistor 25 has a source region isolated from all other devices with a source terminal 23 and a dedicated gate region having a gate terminal 24. The base cell 1 also comprises a bulk contact 8 connecting the N-well 4 to a first voltage supply 9 and a bulk contact 18 connecting the P-well 5 to a second voltage supply 19.

It should be emphasized that, advantageously according to present disclosure, the configuration of the base cell 1 shown in FIG. 1 allows the active area of the second PMOS transistor 15 and of the first NMOS transistor 20 to be higher than the active area of the first PMOS transistor 10 and of the second NMOS transistor 25. This is due to the fact that the second PMOS transistor 15 and the first NMOS transistor 20 share the common gate terminal 17. This allows the active area of both transistors to be bigger since there is more space on both the PMOS and NMOS sides.

In fact, the active area of a transistor is vertically developed, but it cannot be placed under a gate contact. For transistors having a common gate terminal, more space can be used to provide a bigger active area, contrary to the prior art approaches which comprise separate gate terminals.

Also advantageously, the base cell 1 has a common gate terminal 17 for a first pair of CMOS transistors, namely the second PMOS transistor 15 and the first NMOS transistor 20, and separate gates for a second pair of CMOS transistors, namely the first PMOS transistor 10 and the second NMOS transistor 25 (independently driven MOS). Advantageously, the base cell 1 has an asymmetric structure with respect to a possible middle symmetry axis. This configuration is useful to allow separate gate structures and without impacting the place and route efficiency of the ECO base cell 1 itself.

Also advantageously, the base cell 1 has the layout layer up to the contacts fixed and it does not use the modification of metal contact layer for the customization. In fact, all the front-end masks are well fixed and the ECO customization needs one less mask modification with respect to the prior art ECO base cell.

Figure 2:
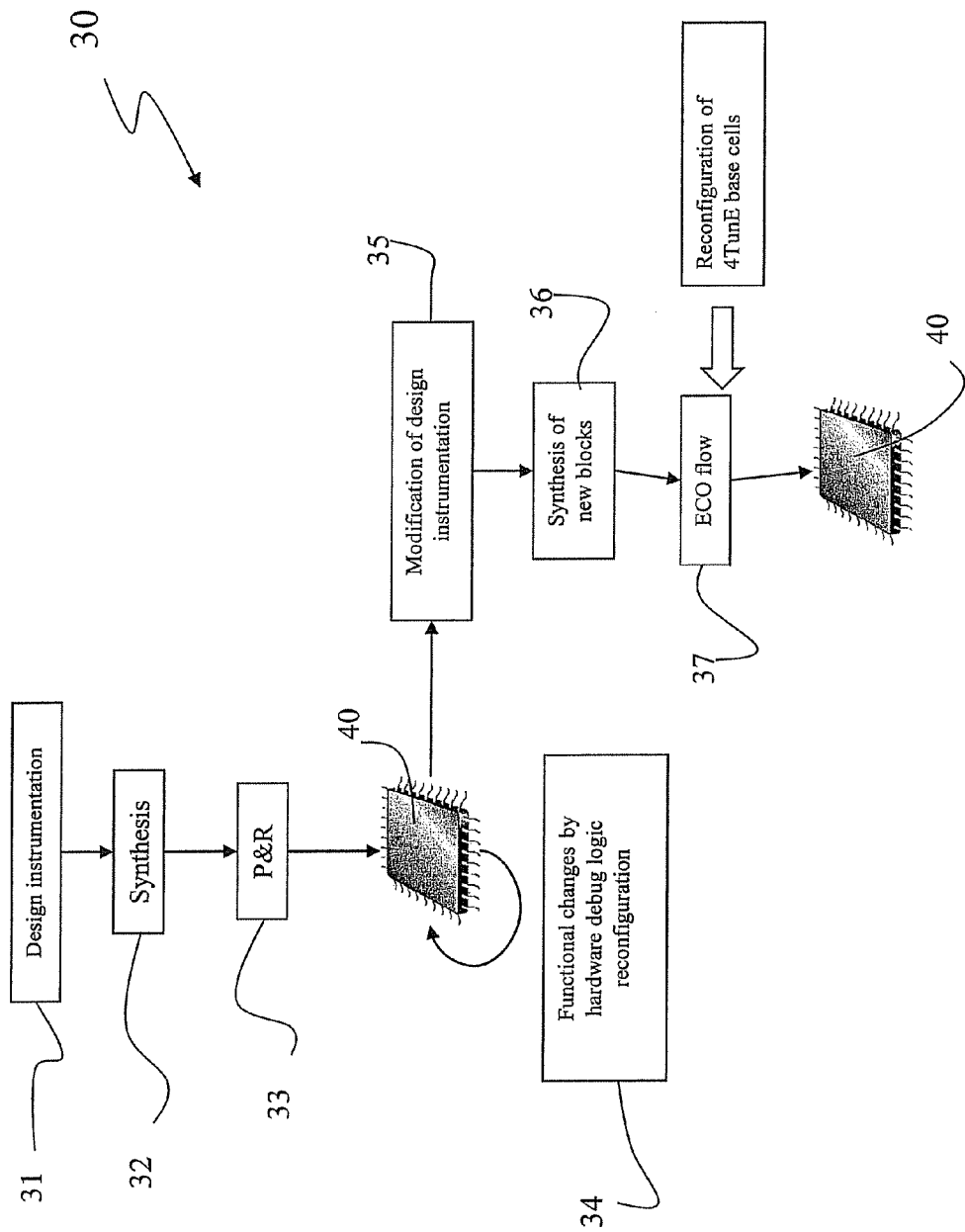
FIG. 2 is a flowchart of the method for implementing a debug infrastructure logic according to the invention.

The ECO base cell 1 is advantageously used as a filler cell by the method described herein. Referring specifically to FIG. 2, a schematic flow diagram 30 is shown of the method for implementing changes to a design layout by implementing a debug infrastructure logic according to the present disclosure, which uses ECO base cells as previously described and shown in FIG. 1.

In more general terms, the method is for implementing changes to the functionality of a design layout of an integrated device, in particular a SoC. The method may comprise the steps of: providing design instrumentation with a debug infrastructure logic by using at least one standard logic cell or by placing at least one standard logic cell in at least one spare region of the design layout according to a preliminary design file; executing a standard synthesis of the design files according to the preliminary design file; and executing a Place & Route of the design layout by replacing standard filler cells with mask programmable ECO base cells configured as filler cells.

The method may also include implementing functional changes on the design layout by exploiting a via software reconfiguration capability of the debug logic infrastructure based on logic blocks which are obtained by using the at least one standard logic cell or by replacing the at least one standard logic cell with at least one mask programmable ECO base cell 1 configured as functional logic cell; executing a modification of the design instrumentation; executing a synthesis of the modification applied to the debug infrastructure logic; and executing on the integrated device, in particular the SoC, an ECO flow by replacing at least one mask programmable ECO base cell configured as filler cell and placed during the Place & Route phase with at least one mask programmable ECO base cell configured as a functional cell.

In particular, the method comprises a first step 31, wherein a design is instrumented by hardware debug infrastructure logic. In particular, the design instrumentation step comprises adding to the design layout embedded IP blocks, called Infrastructure IP or I-IP, specifically developed to address a post-silicon validation step. Since a design can be instrumented in a different way, it is helpful to select an instrumentation strategy, for instance, selecting the signals which have to be monitored and/or the signals which can be controlled on the final device, also after post-silicon.

Then, new RTL files are generated, containing customized debug structures or modules. The generated RTL files are still synthesizable and can be formally compared with the original RTL files, to verify their functional correctness.

The method also comprises a second step 32, wherein a standard synthesis is performed. Since the debug infrastructure logic can be implemented using mask programmable ECO base cells, during the synthesis phase, it is possible to replace, according to the needs of a preliminary design file, standard library cells that provide the generic logic functions, such as inversion, NAND, Flip-Flop, etc., with an ad-hoc ECO base cell library, called 4TunE library, which includes ECO base cells 1 configured as functional cells and specifically developed for DfD infrastructure logic implementation.

In particular, the ad-hoc library includes coarse grain functions implemented as single functional cells. Moreover, the coarse grain functions include a complex function implemented by using at least one cell pair of a generic ECO library. Suitably, the information for area occupation of the cells pairs is extracted from a taped out net-list.

Then, in a third step 33, a standard Place & Route flow is performed, by replacing, according to the needs of a preliminary design file, standard filler cells with the mask programmable ECO base cells 1, called 4TunE base cells, which are configured as filler cells. Since the debug infrastructure logic can be completely implemented using only the mask programmable ECO base cells, during the Place & Route phase, if necessary, such ECO base cells configured as functional cells can be also placed and routed by the Place & Route tool, according to a preliminary design file.

In a fourth step 34, functional changes are then implemented on a SoC 40 advantageously exploiting a hardware debug logic, which can be reconfigured via software. If the hardware debug infrastructure logic reconfiguration is not able to implement the requested functional changes, then it is helpful to modify the original design layout instrumentation as indicated by a fifth step 35. A sixth step 36 provides a synthesis of new or modified logic IP blocks through the ECO base cells 1 configured as functional cells and specifically developed for DfD infrastructure logic implementation. The method then comprises a seventh step 37, wherein an ECO flow is executed on the SoC 40 in order to implement new functionalities, such as a debug capability modification, through the reconfiguration of the ECO base cells 1.

In particular, the at least one mask programmable ECO base cell is already placed in the layout design as a filler cell and changes configuration from a filler cell to a functional logic cell by way of only metal layer changes. It is also remarked that, advantageously, according to the present disclosure, the coarse grain function cells, implemented as single functional cells, have smaller area than a equivalent total area of basic cells needed for coarse grain function implementation. Also, they have better timings than an equivalent total timings of basic cells needed for coarse grain function implementation.

Moreover, the debug infrastructure logic implemented using the ad-hoc library has reduced impact on routing congestion than the equivalent implementation using basic cells for coarse grain function implementation. Advantageously, the design instrumentation step can be performed at RTL or gate level in order to implement the modification on a taped out net-list. The design instrumentation step is fully integrated in a standard implementation flow and it is technology independent.

Figure 3:
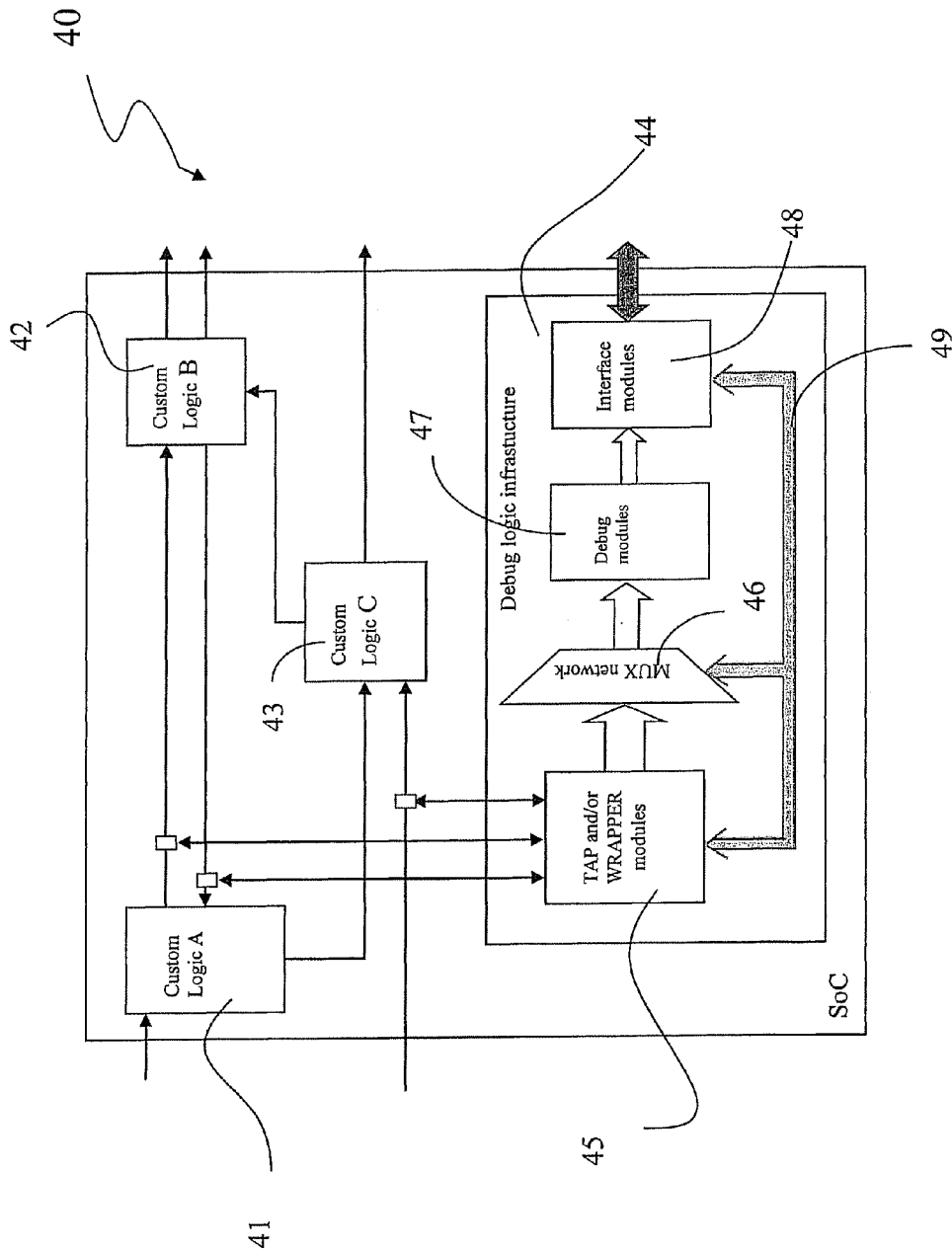
FIG. 3 is a schematic block diagram of a SoC instrumented with a debug infrastructure logic implemented by the method according to the invention.

FIG. 3 shows the SoC 40 in which a hardware debug infrastructure logic used for the first step 31 of design layout instrumentation is implemented. In particular, the SoC 40 comprises a first 41, a second 42, and a third custom logic block 43, which are connected and exchange signals between them and outside the SoC 40. In addition, the SoC 40 is instrumented by a hardware debug infrastructure logic 44 which comprises several types of software re-configurable instruments or modules, and namely, in the example shown in FIG. 3.

A hardware logic module 45 includes Test Access Port (TAP) and/or wrapper modules, which allow observation and control of critical signals received from the logic blocks 41, 42 and 43, and is re-configurable via dedicated software that permit modification of the behavior of the signals connected to it, i.e. the control critical signals, thus implementing the fourth step of the design layout instrumentation modification; a multiplexer network module 46, which connects the signals from the hardware logic module 45, namely tapped and/or wrapped signals, to a debug module 47 for data storage purposes; the debug module 47 which comprises, for instance, a tracer memory to collect data in a dedicated dual port memory buffer and a programmable trigger engine module (not shown) in order to build trigger functions to enable and to disable data storage; and interface modules 48 dedicated to manage communication with the external world including Serial Access Nodes (SANs) and Preliminary CONtrollers (PCONs).

The hardware logic module 45, the multiplexer network module 46, and the interface modules 48 are also connected to each other by way of a bus 49. Advantageously, on the final device, after the silicon step from the semiconductor process, the hardware logic module 45, in particular, a re-configurable wrapper module comprised therein, can be used to modify the behavior of instrumented signals to evaluate functional change.

Advantageously, since the memory buffer included in the debug module 47 can be mapped using only registers, instead of a dedicated memory block, the hardware debug infrastructure logic 44 can be completely implemented through an ECO flow in which are used the ECO base cells 1 configured as functional cells. Such implementation drastically reduces the area cost needed for the debug logic infrastructure, since it exploits only the filler cells area.

Advantageously, to increase the number of observable or controllable signals, after the silicon step from the semiconductor process, it is possible to modify the instrumentation strategies working on the gate level net-list, adding tap points and/or wrap modules and re-using some debug modules, such as SAN, PCON and JTAG TAP controller modules, that can be considered fixed and common modules to all instrumentation strategies.

In addition, after a design instrumentation modification, new or modified blocks have to be synthesized using a 4TunE cells library specifically developed for debugging purpose and after new debug logic synthesis. The taped-out net-list has to be modified to replace the old logic with the new one. Then, within the P&R tool, it is possible to use the ECO flow to implement the new logic. In particular, ECO base filler cells 1 can be replaced by logic cells based on ECO base cells 1 to implement new functionalities exploiting their configurable metal characteristic.

To develop an ad-hoc 4TunE cells library for debugging purpose, the net-list has been analyzed to understand the kinds of logic cells used to implement the debug infrastructure logic. In fact, it is possible to extract from the net-list some information on the area related to logic cells pair used in the synthesized debug modules, bypassing buffers.

Considering that more than 60% of total debugging logic area has been built by logic cells pairs, such as ANDOR-FlipFlop, inverter-ANDOR and ANDOR-ANDOR pairs, advantageously, according to the present disclosure it is possible to develop an ad-hoc ECO base cells 1 (4TunE) library to implement such cells pairs.

The area reduction obtained using the method is indicated in table I, shown in FIG. 4. In particular, a logic cell made by the union of the most commonly used cells pairs can take advantage of the unused transistors in each one of the initial cells becoming from a generic ECO library instead of an ad-hoc library for DfD.

In particular, the cells pairs indicated in table I, shown in FIG. 4, are generic logic cells comprised in a generic library, in particular, a 90 nm standard library cells, which have been used only by way of a non-limiting example. Such a table also reports the number of 4TunE base cells that are to be used in order to obtain same features of a standard cell library as well as the number of 4TunE base cells to be used by the coarse grain function according to the invention and the percentage of area saving.

In conclusion, the method according to the invention allows for a new flexible debug logic that can be programmed and thus adapted to the silicon validation needs, using a silicon area that is left free for mask programmable filler cells placement, thus reducing the extra cost in terms of area. In fact, by exploiting the characteristic of ECO base cells, it is possible to develop an ad-hoc library to reduce area occupation needed to implement the debug infrastructure logic.

In addition, the timing closure is improved by using these new cells because they are characterized as single standard cells. As a consequence, the delay of this new cell is reduced with respect of the cells pair delays. This is due to the fact that the new coarse grain cell is more compact (less routing overhead and/or less area) than the cells pair it is paired with. As a consequence timing delay is smaller. Moreover, routing congestion, which is a critical problem during ECO flows, is prevented by using this ad-hoc library due to the fact that the new, smaller ECO base cell already provides the connection between the cells pairs, optimizing the metal usage.

Another advantage is that after the silicon step from the semiconductor process, the hardware logic module 45 of the hardware debug infrastructure logic 44, and namely the re-configurable wrapper module comprised therein, can be used to modify the behavior of instrumented signals to evaluate functional change, avoiding costly silicon re-spins. Finally, advantageously according to the present disclosure, a software re-configurable debugging infrastructure logic is obtained through mask-programmable filler cells. The instrumentation of a device, in particular a SoC, with such debug infrastructure logic allows the implementation of functional changes on silicon, without the need of metal fixing.

In particular, advantageously according to the invention, coarse grain cells based on the ECO base cell are used. These coarse grain cells are developed to optimize the area, timing and routing overhead impact of the ECO on the SoC.

Obviously, a technician of the field, aiming at meeting incidental and specific needs, may bring several modifications to the above described method, all within the scope of protection of the invention as defined by the following claims.

That which is claimed is:
1. A method for making changes to a design layout of a System-on-Chip (SoC) integrated circuit device, the method comprising:
providing a design instrumentation with debug infrastructure logic on the design layout of the SoC integrated circuit device based upon an initial design file, the debug infrastructure logic based upon filler cells in at least spare regions of the initial design file and logic cells in the initial design file;

executing a synthesis of the initial design file;

executing a Place & Route of the design layout by replacing the filler cells with mask programmable Engineering Change Order (ECO) base cells configured as filler cells;

implementing functional changes on the SoC integrated circuit device via a software reconfiguration capability of the debug infrastructure logic based upon logic blocks obtained by performing at least one of substituting at least one mask programmable ECO base cell configured as a functional logic cell for at least one of the logic cells, and using the logic cells;

executing a modification of the design instrumentation, and executing a synthesis of the modification applied to the debug infrastructure logic; and executing on the SoC integrated circuit device an ECO process by replacing at least one of the mask programmable ECO base cells configured as the filler cells and placed during the Place & Route execution with the at least one mask programmable ECO base cell configured as the functional cell.

2. The method according to claim 1 wherein executing the synthesis of the modification applied to the debug infrastructure logic comprises using an ad-hoc library comprising the mask programmable ECO base cells used to build functional cells.

3. The method according to claim 2 wherein the ad-hoc library includes coarse grain functions implemented as single functional cells.

4. The method according to claim 3 wherein the coarse grain functions include a complex function using at least one cell pair of an ECO library.

5. The method according to claim 4 wherein area occupation of the at least one cell pair is extracted from a taped-out net-list.

6. The method according to claim 1 wherein the modification applied to the debug infrastructure logic is implemented using a mask programmable filler cell area.

7. A method for making changes to a design layout of an integrated circuit (IC) device, the method comprising:

providing a design instrumentation with debug infrastructure logic on the design layout for the IC device based upon an initial design file, the debug infrastructure logic based upon filler cells in at least spare regions of the initial design file and logic cells in the initial design file;

executing a Place & Route of the design layout by replacing the filler cells with mask programmable Engineering Change Order (ECO) base cells configured as filler cells;

implementing functional changes on the IC device via a software reconfiguration capability of the debug infrastructure logic based upon logic blocks obtained by performing at least one of substituting at least one mask programmable ECO base cell configured as a functional logic cell for at least one of the logic cells, and using the logic cells;

executing a modification of the design instrumentation, and executing a synthesis of the modification applied to the debug infrastructure logic; and executing on the IC device an ECO process by replacing at least one of the mask programmable ECO base cells configured as the filler cells and placed during the Place & Route execution with the at least one mask programmable ECO base cell configured as the functional cell.

8. The method according to claim 7 wherein executing the synthesis of the modification applied to the debug infrastructure logic comprises using an ad-hoc library comprising the mask programmable ECO base cells used to build functional cells.

9. The method according to claim 8 wherein the ad-hoc library includes coarse grain functions implemented as single functional cells.

10. The method according to claim 9 wherein the coarse grain functions include a complex function using at least one cell pair of an ECO library.

11. A System-on-Chip (SoC) comprising:

a plurality of logic blocks connected to each other and to external connections; and a hardware debug infrastructure logic connected to said plurality of logic blocks and for performing functional changes to a design layout of the SoC;

said hardware debug infrastructure logic comprising software re-configurable modules based upon said plurality of logic blocks obtained from performing at least one of substituting at least one mask programmable ECO base cell configured as a functional logic cell for a logic cell in the design layout, and using the logic cell.

12. The SoC according to claim 11 wherein the software re-configurable modules comprise:

a hardware logic module for monitoring and controlling signals received from said plurality of logic blocks and being re-configurable via software to permit modification of the signals and to verify the functional changes;

a debug module comprising a tracer memory for collecting data in a dual port memory buffer and a programmable trigger engine module for building trigger functions to enable and disable data storage;

a multiplexer network module for connecting said hardware logic module to said debug module for the data storage; and interface modules for managing communication between the SoC and the external connections.

13. The SoC according to claim 12 wherein said hardware logic module comprises at least one of a Test Access Port (TAP) module and a wrapper module for debugging.

14. The SoC according to claim 11 wherein coarse grain cells based upon mask programmable ECO base cells are used for implementing changes to functionality of the design layout of the SoC.

* * * * *